United States Patent
Rhee et al.

(10) Patent No.: US 7,250,228 B2
(45) Date of Patent: Jul. 31, 2007

(54) YTTRIUM-DOPED BISMUTH TITANATE THIN FILM AND PREPARATION THEREOF

(75) Inventors: Shi-Woo Rhee, Pohang-si (KR); Sang-Woo Kang, Seoul (KR)

(73) Assignee: Postech Foundation (KR)

( * ) Notice: Subject to any disclaimer, the term of this patent is extended or adjusted under 35 U.S.C. 154(b) by 562 days.

(21) Appl. No.: 10/672,753

(22) Filed: Sep. 26, 2003

(65) Prior Publication Data
US 2004/0071875 A1    Apr. 15, 2004

(30) Foreign Application Priority Data
Sep. 28, 2002  (KR) ................ 10-2002-0059111

(51) Int. Cl.
*B32B 9/00* (2006.01)
*C23C 16/00* (2006.01)

(52) U.S. Cl. ............ 428/702; 428/701; 427/255.19; 29/592.1; 29/255.32; 29/255.395

(58) Field of Classification Search ........... 428/615, 428/701, 702
See application file for complete search history.

(56) References Cited

FOREIGN PATENT DOCUMENTS
JP    P-2003-151976 A    6/2003

*Primary Examiner*—Jennifer McNeil
*Assistant Examiner*—Aaron S. Austin
(74) *Attorney, Agent, or Firm*—Anderson Kill & Olick, PC

(57) ABSTRACT

A bismuth yttrium titanate (BYT) film having the composition of formula (I) has enhanced residual polarization and electric fatigue properties with excellent ferroelectric property, and therefore, it can be advantageously used in an electric or electronic device including a FRAM device:

$$Bi_{4-x}Y_xTi_3O_{12} \qquad (I)$$

wherein x is an integer of 0.1 to 2.

9 Claims, 2 Drawing Sheets

Crystallinity of BYT film

Crystallinity of BLT film

Crystallinity of BYT film

Crystallinity of BLT film

YTTRIUM-DOPED BISMUTH TITANATE THIN FILM AND PREPARATION THEREOF

FIELD OF THE INVENTION

The present invention relates to a ferroelectric yttrium-doped bismuth titanate ($Bi_{4-x}Y_xTi_3O_{12}$ ($0.1 \leq x \leq 2$)) thin film having excellent electric polarization and fatigue properties; and a process for the preparation thereof.

BACKGROUND OF THE INVENTION

FRAM (ferroelectric random access memory) devices have been widely used because of such desirable performance characteristics as non-volatility, high speed, large capacity and low power-consumption.

Bismuth titanate(BTO, $Bi_4Ti_3O_{12}$) which undergoes phase-transition at its Curie temperature of 675° C. is a well-known ferroelectric material for the FRAM device. However, this material exhibits high electric fatigue, that is, the residual polarization value decreases after a number of depolarization cycles. Further, a strontium bismuth tantalate (SBT, $SrBi_2Ta_2O_9$) layer which is also known as a ferroelectric material requires a high crystallization temperature of 800° C. or higher although it has good electric fatigue property, and a lead zirconium titanate (PZT, $PbZr_xTi_{1-x}O_3$ ($0 < x < 1$)) layer having a relatively low crystallization temperature exhibits early fatigue only at $10^6$ cycles.

Furthermore, it was recently reported by the present inventors that a bismuth lanthanium titanate (BLT, $Bi_{4-x}La_xTi_3O_{12}$ ($0 < x < 4$)) layer needs a relatively low crystallization temperature of around 700° C., and that it exhibits no sign of fatigue even after $10^{10}$ cycles (see [B. H. Park, et al., *Nature*, 401(14), 682(1999)]).

The present inventors have further studied to develop a novel ferroelectric thin film, and as a result, found that the doping with yttrium (Y) can improve the ferroelectric properties of the BTO composition because an oxide film of Y has a lower heat (-1815 kJ/mole) of formation than that (-1703.2 kJ/mol) of lanthanium (La).

SUMMARY OF THE INVENTION

Accordingly, it is an object of the present invention to provide a Y-doped bismuth titanate thin film.

It is another object of the present invention to provide a process for preparing the Y-doped bismuth titanate thin film by chemical vapor deposition or sputtering, and a FRAM device comprising said film as a ferroelectric layer.

In accordance with one aspect of the present invention, there is provided a bismuth yttrium titanate (BYT) film having the composition of formula (I):

$$Bi_{4-x}Y_xTi_3O_{12} \qquad (I)$$

wherein x is an integer of 0.1 to 2.

In accordance with another aspect of the present invention, there is provided a process for depositing a BYT($Bi_{4-x}Y_xTi_3O_{12}$ ($0.1 \leq x \leq 2$)) thin layer on a substrate.

In accordance with a further aspect of the present invention, there is provided an electric or electronic device comprising a BYT($Bi_{4-x}Y_xTi_3O_{12}$ ($0.1 \leq x \leq 2$)) thin layer.

BRIEF DESCRIPTION OF THE DRAWINGS

The above and other objects and features of the present invention will become apparent from the following description of the invention, when taken in conjunction with the accompanying drawings which respectively show.

DETAILED DESCRIPTION OF THE INVENTION

Figure 1A:
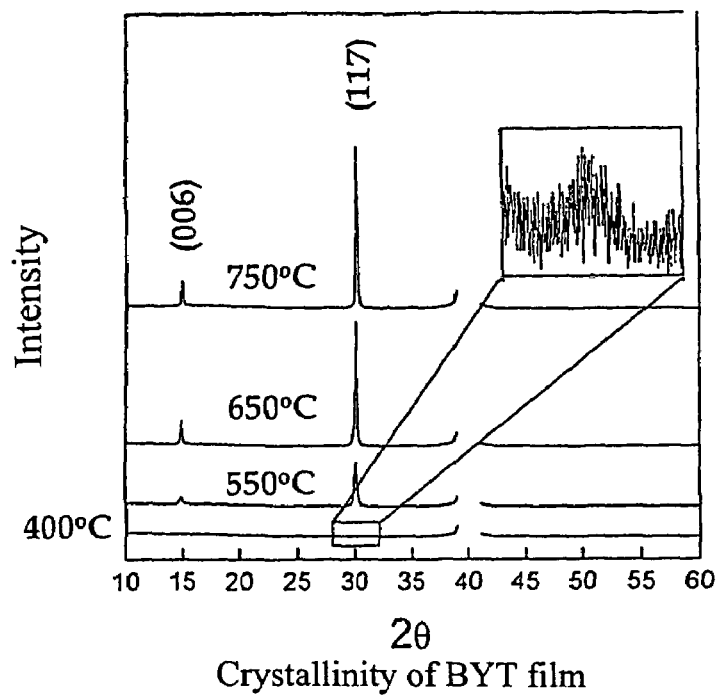
FIGS. 1a and 1b: the crystallinity properties of a BYT film according to the present invention and the existing BLT film depending on the heat treatment temperature.

The BYT film having the composition of formula (I) according to the present invention can be obtained by doping a ferroelectric bismuth titanate(BTO, $Bi_4Ti_3O_{12}$) with a specific amount of an yttrium (Y) component.

The BYT film may be formed by a MOCVD(metallorganic chemical vapor deposition) or sputtering process.

In the MOCVD, preferably a DLI (direct liquid injection)-MOCVD process, a Y precursor, a Ti precursor and a Bi precursor are brought into contact with the surface of a substrate heated to form a BYT thin film. At this time, each precursor is preferably dissolved in an organic solvent, the resulting solution is injected into an evaporator maintained at a temperature ranging from 200 to 300° C. to vaporize, and the vapors are simultaneously introduced into a deposition chamber with an appropriate carrier gas flow. The carrier gas used in this process may be an inert gas such as argon and nitrogen. If necessary, the precursor vapor alone may be transported without the use of a carrier gas. In preparing the injection solution, an organic solvent such as n-butylacetate, heptane, octane and tetrahydrofuran(THF) may be used.

Further, in the MOCVD process, oxygen is used as a reaction gas, and the temperature of the substrate may range from 250 to 700° C. while the pressure of the deposition chamber may range from 0.01 to 10 torr(mmHg). This deposition condition may be varied depending the composition of the film to be obtained.

The Ti precursor used in the present invention may be preferably a titanium alkoxyamine such as $Ti(dmae)_4$ (dmae=dimethylaminoethoxide) and $Ti(dmap)_4$ (dmap=dimethylaminopropanol); a titanium alkoxide such as $Ti(i-OPr)_4$; and titanium amido compounds such as $Ti(N(C_2H_5)_2)_4$, $Ti(N(CH_3)_2)_4$ and $Ti(N(C_2H_5)(CH_3))_4$. $Ti(dmae)_4$ is more preferred because it is a liquid at room temperature (see [J. H. Lee et al., *J. Vac. Sci. Technol.*, 17(1999), 3033]).

Representative examples of the Bi precursor which may be used in the present invention are $Bi(phenyl)_3$, $Bi(tmhd)_3$ (tmhd=tetramethylheptadionate), $Bi(CH_3)_3$, $Bi(O-t-(C_4H_9)_3$, $Bi(C_7H_7)_3$, and $Bi(O-t-(C_5H_{11})_3$.

Further, representative examples of the Y precursor may include $Y(tmhd)_3$-PMDT (tmhd=tetramethylheptadionate, PMDT=pentamethyl diethylenetriamine), $Y(tmhd)_3$ and $Y(N(Si(CH_3)_3)_2)_3$.

In the present invention, the BYT thin film may be deposited by a sputtering method. The sputtering may be conducted by a conventional method using a target containing Ti, Bi and Y components and an oxygen source such as an oxygen or $N_2O$ gas plasma and, optionally, an inert gas for improving the deposition or decomposition efficiency.

In accordance with the present invention, a BYT thin layer thus deposited may be heat-treated to impart crystallinity thereto. The heat treatment may be conducted at 500 to 800° C.

The substrate which can be used in the present invention includes silicon, Pt, Ir, $IrO_2$, Ru, $RuO_2$ and others. The thickness of the inventive BYT layer may be conveniently controlled by adjustment of the deposition time, generally in the range of 50 to 400 nm.

The inventive BYT thin film has enhanced residual polarization and electric fatigue properties with excellent ferroelectric property, and therefore, it can be advantageously used in an electric or electronic device including a FRAM device having high speed, large capacity, low electric power and nonvolatile property.

The following Examples are given for the purpose of illustration only, and are not intended to limit the scope of the invention.

EXAMPLE

Deposition of BYT Thin Layer

A BYT thin film was formed on a $Pt/TiO_2/SiO_2/Si$ substrate by MOCVD employing $Y(tmhd)_3$-PMDT, $Ti(dmae)_4$ and $Bi(phenyl)_3$ as follows.

0.02 M solution of $Y(tmhd)_3$-PMDT, 0.09 M solution of $Ti(dmae)_4$ and 0.15 M solution of $Bi(phenyl)_3$ in n-butyl acetate were injected into the vaporizer of an MOCVD apparatus at a rate of 0.1 ml/min. The deposition was conducted under the conditions of evaporation temperature (vaporizer) of 240° C., $Ar/O_2$ flow rates of 200/400(sccm), reactor pressure of 1.5 torr, vaporizer pressure of 5 torr and substrate temperature of 400° C., to prepare a 100 nm-thick BYT thin layer.

The BYT thin layer thus deposited was heat-treated at 400, 550, 650 or 750° C. for 1 hr, and the crystallinity thereof was analyzed.

The above procedure was repeated using $La(tmhd)_3$-PMDT instead of $Y(tmhd)_3$-PMDT, to form a BLT thin film as a control, which was also analyzed for its crystallinity.

Figure 1B:
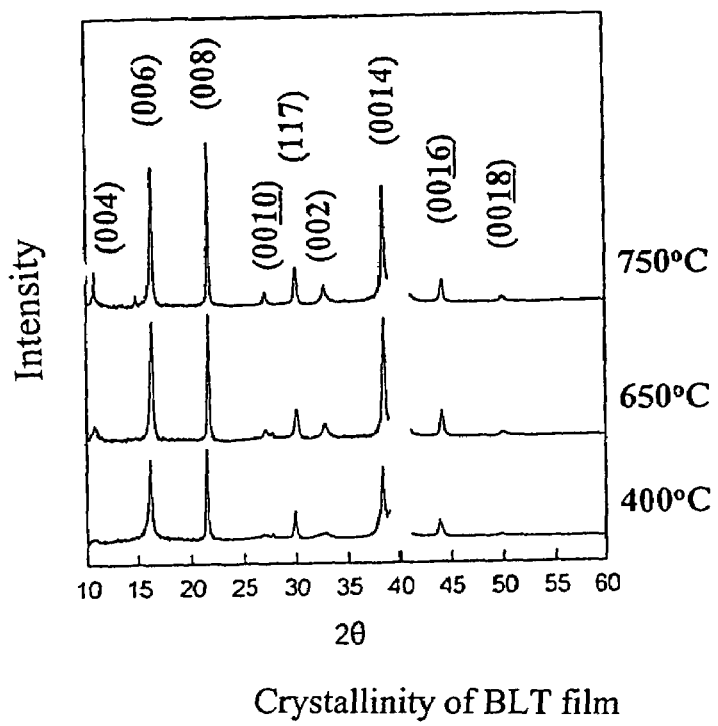

The results of the crystallinity analyses of the BYT film and the BLT film are shown in FIGS. 1a and 1b, respectively, which exhibit that the BYT film according to the present invention preferentially has a crystal orientation of (117) unlike the existing BLT film, and thus, the inventive BYT film has a higher polarization value.

Figure 2:
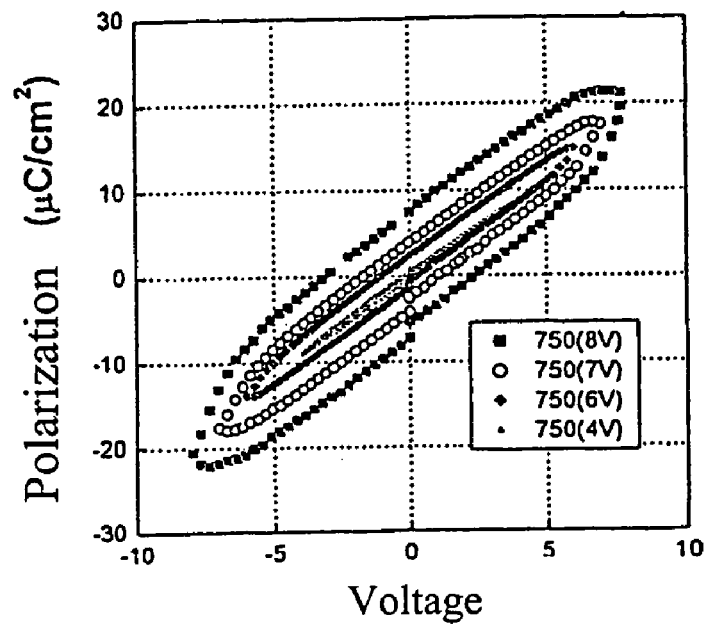
FIG. 2: the polarization characteristics of a BYT film according to the present invention.
Figure 3:
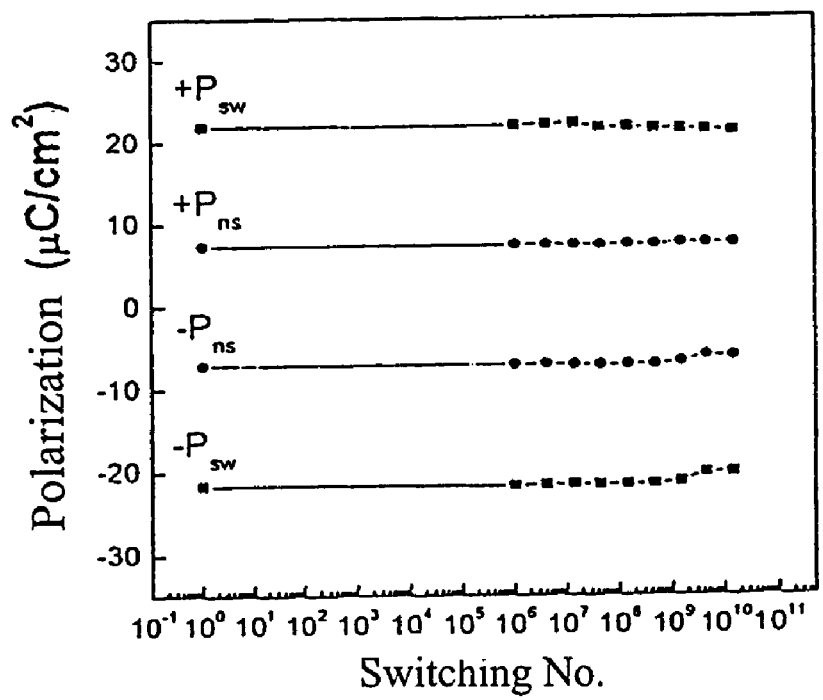
FIG. 3: the electric fatigue characteristics of a BYT film according to the present invention.

Further, the inventive BYT film was analyzed for the electrical property, and the analysis results for the polarization value and the electric fatigue are shown in FIGS. 2 and 3, respectively, which show improved polarization values and fatigue property (sw=switched state, ns=non-switched state) of the inventive BYT film, suitable for use in manufacturing a semiconductor device such as a ferroelectric random access memory (FRAM) device.

While the invention has been described with respect to the above specific embodiments, it should be recognized that various modifications and changes may be made to the invention by those skilled in the art which also fall within the scope of the invention as defined by the appended claims.

What is claimed is:

1. A bismuth yttrium titanate (BYT) thin film having the composition of formula (I):

$$Bi_{4-x}Y_xTi_3O_{12} \qquad (I)$$

wherein x is an integer of 0.1 to 2.

2. A process for preparing a bismuth yttrium titanate (BYT) thin film according to claim 1, which comprises bringing the vapors of a Y precursor, a Ti precursor and a Bi precursor into contact with a substrate, together with an oxygen source.

3. The process of claim 2, wherein the Ti precursor is selected from the group consisting of $Ti(dmae)_4$(titanium tetradimethylaminoethoxide), $Ti(dmap)_4$(titanium tetradimethylaminopropanol), $Ti(i-OPr)_4$, $Ti(N(C_2H_5)_2)_4$, $Ti(N(CH_3)_2)_4$ and $Ti(N(C_2H_5)(CH_3))_4$.

4. The process of claim 2, wherein the Bi precursor is selected from the group consisting of $Bi(phenyl)_3$, $Bi(t-mhd)_3$ (tmhd=tetramethylheptadionate), $Bi(CH_3)_3$, $Bi(O-t-(C_4H_9)_3$, $Bi(C_7H_7)_3$, and $Bi(O-t-(C_5H_{11})_3$.

5. The process of claim 2, wherein the Y precursor is selected from the group consisting of $Y(tmhd)_3$-PMDT (tmhd=tetramethylheptadionate, PMDT=pentamethyldiethylenetriamine), $Y(tmhd)_3$ and $Y(N(Si(CH_3)_3)_2)_3$.

6. The process of claim 2, wherein the substrate was heated to a temperature ranging from 250 to 700° C.

7. The process of claim 2, wherein the precursor vapors are generated by dissolving the precursors in an organic solvent and subjecting the solution to a temperature ranging from 200 to 300° C.

8. The process of claim 2, which further comprises heat-treating the BYT thin film at 500 to 800° C. to impart crystallinity thereto.

9. An electric or electronic device comprising the BYT thin film according to claim 1.

* * * * *